United States Patent [19]

Umeyama

[11] Patent Number: 5,270,883
[45] Date of Patent: Dec. 14, 1993

[54] MAGNETIC READ/WRITE CIRCUIT
[75] Inventor: Takehiko Umeyama, Itami, Japan
[73] Assignee: Mitsubishi Denki Kabushiki Kaisha, Tokyo, Japan
[21] Appl. No.: 878,517
[22] Filed: May 5, 1992
[30] Foreign Application Priority Data
 Aug. 29, 1991 [JP] Japan .................. 3-218185
[51] Int. Cl.⁵ .............. G11B 5/02; G11B 15/12; H03F 3/45
[52] U.S. Cl. .................. 360/67; 330/259; 360/61
[58] Field of Search ........ 360/67, 64, 46, 61, 360/62, 68, 60; 330/259, 9, 261

[56] References Cited
U.S. PATENT DOCUMENTS 4,429,282  1/1984  Saari .................. 330/9
4,833,418  5/1989  Quintus et al. .......... 330/259 X
5,218,320  6/1993  Albouy et al. ............ 330/259

FOREIGN PATENT DOCUMENTS 52-72210  6/1977  Japan .................. 360/67
2-246604  2/1990  Japan .................. 330/259

Primary Examiner—Donald Hajec
Assistant Examiner—Patrick Wamsley
Attorney, Agent, or Firm—Oblon, Spivak, McClelland, Maier & Neustadt

[57] ABSTRACT

Disclosed herein is a magnetic read/write circuit which causes only small fluctuation of an output offset in mode switching. When a head (HD3) is switched to a head (HD6) in read mode, amplifiers (2) and (5) are turned off and on respectively. An offset caused by the amplifier (5) is reduced by negative feedback which is provided by an offset detection circuit (46) and an offset adjusting circuit (5) so that an amplifier (19) will not enhance an offset caused by difference between the amplifiers. During a constant period after mode switching, outputs of an amplifier (40) are transmitted to differential output terminals (26, 27). Input ends of the amplifier (40) are so shorted that an offset of the outputs thereof is suppressed small. After a lapse of the constant period, the outputs of the amplifier (19) are transmitted to the differential output terminals (26, 27).

14 Claims, 8 Drawing Sheets

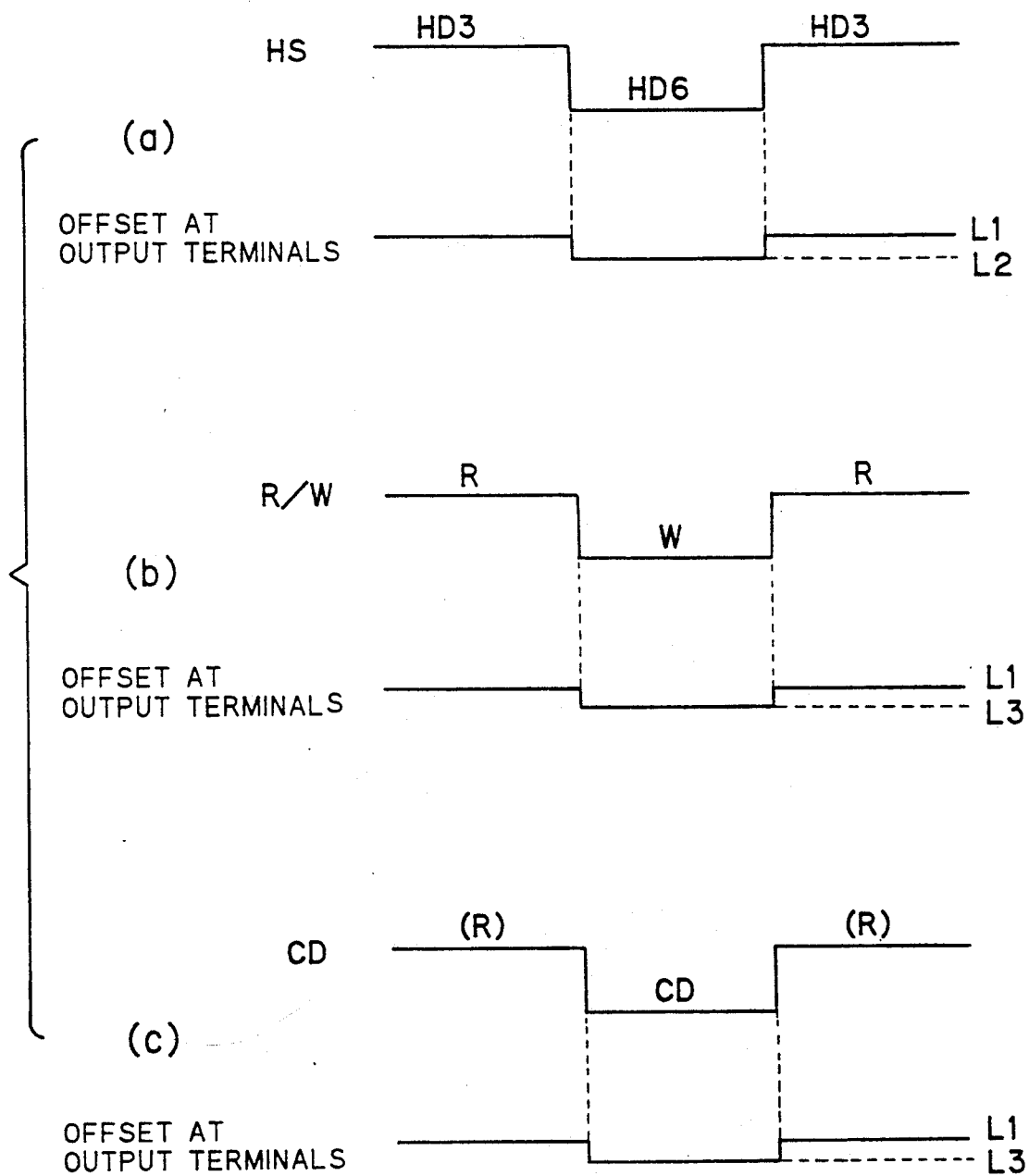

MAGNETIC READ/WRITE CIRCUIT

BACKGROUND OF THE INVENTION

1. Field of the Invention

The present invention relates to a technique of reducing an output offset in an input/output circuit, particularly in a magnetic read/write circuit.

2. Description of the Background Art

FIG. 7 shows an exemplary structure of a part, which is related to a reproducing circuit, of a conventional magnetic read/write circuit. Center taps of heads 3 and 6 (HD3 and HD6) are connected in common and biased to a potential $V_{CT}$ through a power source 4. The heads 3 and 6 are connected to differential input ends of amplifiers 2 and 5 respectively. Differential output ends of the amplifier 2 are connected to first ends of resistors 7 and 8 through lines 9 and 10 respectively. Differential output ends of the other amplifier 5 are also connected to the first ends of the resistors 7 and 8 through lines 11 and 12 respectively. Second ends of the resistors 7 and 8 are connected to a power source 1.

The lines 9 and 11 are connected to a differential input end of an output stage amplifier 19 through a buffer 15 and a line 17, while the lines 10 and 12 are connected to another differential input end of the output stage amplifier 19 through a buffer 16 and a line 18. A differential output end of the amplifier 19 is connected to the power source 1 through a line 20 and a resistor 22, while another differential output end is also connected to the power source 1 through a line 21 and a resistor 23. The lines 20 and 21 are provided with output terminals 26 and 27 (RDX and RDY) respectively.

The amplifiers 2 and 5 are driven and stopped by control switches 24 and 25 respectively. These control switches 24 and 25 are controlled by a control circuit 30 through control lines 28 and 29 respectively. The control circuit 30 is provided with a read/write switching terminal 31 which receives a read/write switching signal R/W, a head selection input terminal 32 which receives a head selection signal HS, and a chip disable control terminal 33 which receives a chip disable signal CD respectively.

In the reproducing circuit having the structure shown in FIG. 7, offset fluctuation disadvantageously appears at the output terminals 26 and 27 in head switching, read/write switching and chip disable switching operations. With reference to FIG. 8, this problem is now described in detail as to the respective operations.

A. In Head Switching Operation (refer to FIG. 8(a))

The head selection signal HS is inputted in the control circuit 30 to turn the control switches 24 and 25 on/off, thereby selecting only one of the amplifiers 2 and 5 for switching the heads. When the head 3 (HD3) is first selected in read mode, the amplifiers 2 and 5 are turned on and off respectively. At this time, the total offset of two-stage amplifiers, i.e., the amplifiers 2 and 19, appears at the output terminals 26 and 27. Referring to FIG. 8, symbol L1 represents the level of this total offset.

When the head 6 (HD6) is selected, the amplifiers 2 and 5 are turned off and on respectively. At this time, the total offset of the two-stage amplifiers, i.e., the amplifiers 5 and 19, appears at the output terminals 26 and 27. Referring to FIG. 8, symbol L2 represents the level of this total offset. When the head 3 is again selected, the offset appearing at the output terminals 26 and 27 returns to the level L1.

When the offsets of the amplifiers 2 and 5 are different from each other, this difference is further increased by the amplifier 19 to vary the offset appearing at the output terminals 26 and 27. Thus, offset fluctuation is caused by a head switching operation.

B. In Read/Write Switching Operation (refer to FIG. 8(b))

When the head 3 (HD3), for example, is selected, the read/write switching signal R/W is inputted in the control circuit 30, to switch a write operation (denoted as "W" in FIG. 8(b)) by a write circuit (not shown in FIG. 7) and a read operation (denoted as "R" in FIG. 8(b)).

As described in the above item A, the offset appearing at the output terminals 26 and 27 is at the level L1 in the read operation. When the operation is switched to write mode, the control switch 24 is also turned off similarly to the control switch 25, whereby only the offset of the amplifier 19 appears at the output terminals 26 and 27. Referring to FIG. 8, symbol L3 represents the level of this offset. When the operation is again switched to read mode, the offset also returns to the level L1.

Therefore, the offset appearing at the output terminals 26 and 27 is varied with switching between read and write operations.

C. In Chip Disable Switching (refer to FIG. 8(c))

When the signal CD is inputted in the control circuit 30 to implement a chip disable state, both amplifiers 2 and 5 are turned off. IF a chip disable state is implemented when the head 3 (HD3) is selected for read mode, therefore, offset fluctuation appears at the output terminals 26 and 27, similarly to the case of the above item B.

As described above, the output offset of the conventional magnetic read/write circuit is disadvantageously varied with switching between various modes.

SUMMARY OF THE INVENTION

The present invention has been proposed for solving the aforementioned problem of the prior art, and an object thereof is to provide a magnetic read/write circuit which can suppress fluctuation of an output offset caused upon switching of modes.

The magnetic read/write circuit according to the present invention comprises differential output terminals, at least one first differential amplifier having output ends for outputting first differential signals, a second differential amplifier having input ends for receiving the first differential signals and output ends being connected with the differential output terminals for outputting second differential signals, a reference signal generating part having output ends being connected with the differential output terminals for outputting reference differential signals, a negative feedback circuit for providing negative feedback to the first differential signals with a variable time constant, and a control circuit for controlling operations of the first and second differential amplifiers, the reference signal generating part and the negative feedback circuit. The control circuit selectively supplies the second differential signals and the reference differential signals to the differential output terminals in synchronization with the operation of the first differential amplifier. Further, the control circuit employs a relatively short time constant in a constant period upon starting of the operation of the first differential amplifier while employing a relatively long time constant in an operation of the first differential amplifier other than the constant period, to control the negative feedback circuit.

According to the present invention, the negative feedback circuit provides negative feedback so that the input offset of the second differential amplifier is reduced. Thus, the output offset of the second differential amplifier is substantially defined by only its own offset. In a constant period between mode switching and sufficient reduction of the output offset of the second differential amplifier caused by this negative feedback, a reference differential signal having a small offset, which is generated by the reference signal generating part, is supplied to the differential output terminals. After a lapse of this constant period, the output of the second differential amplifier is transmitted to the output terminals.

According to the present invention, as hereinabove described, the output offset of the second differential amplifier is reduced by negative feedback after mode switching, and the reference differential signals having a small output offset are supplied to the differential output terminals until the output offset is sufficiently reduced. Since the outputs of the second differential amplifier are transmitted to the output terminals after the output offset thereof is sufficiently reduced, it is possible to suppress offset fluctuation which appears at the output terminals in mode switching.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a timing chart showing the operation of the conventional magnetic read/write circuit.

DESCRIPTION OF THE PREFERRED EMBODIMENT

Figure 1:
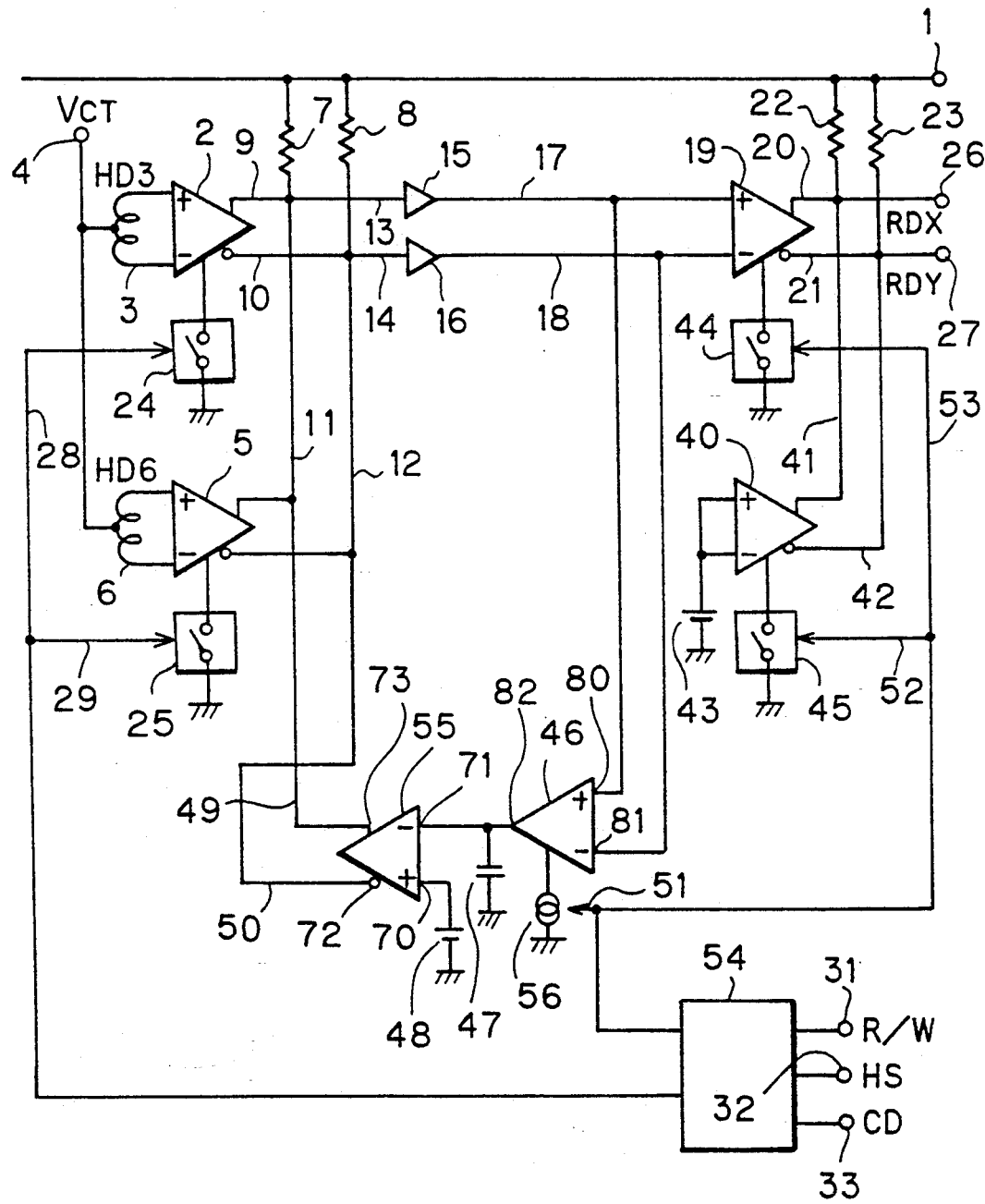
FIG. 1 is a circuit diagram of a magnetic read/write circuit according to an embodiment of the present invention, showing a part which is related to a read operation.

FIG. 1 illustrates the structure of a part, which is related to a reproducing circuit, of a magnetic read/write circuit according to an embodiment of the present invention. Center taps of heads 3 and 6 (HD3 and HD6) are connected in common and biased to a potential $V_{CT}$ by a power source 4. These head 3 and 6 are connected to differential input ends of amplifiers 2 and 5 respectively. Differential output ends of the amplifier 2 are connected to first ends of resistors 7 and 8 through lines 9 and 10 respectively. Differential output ends of the other amplifier 5 are also connected to the first ends of the resistors 7 and 8 through lines 11 and 12 respectively. Second ends of the resistors 7 and 8 are connected to a power source 1.

The lines 9 and 11 as well as the lines 10 and 12 are connected to differential input ends of an output stage amplifier 19 through a buffer 15 and a line 17 as well as a buffer 16 and a line 18 respectively. One differential output end of the amplifier 19 is connected to the power source 1 through a line 20 and a resistor 22 while the other output end thereof is also connected to the power source 1 through a line 21 and a resistor 23. The lines 20 and 21 are provided with output terminals 26 and 27 (RDX and RDY) respectively.

Differential input ends of an amplifier 40 are short-circuited and biased by a power source 43. Differential output ends of the amplifier 40 are connected to the output terminals 26 and 27 through lines 41 and 42 respectively.

The amplifiers 2, 5, 19 and 40 are driven and stopped by control switches 24, 25, 44 and 45 respectively. The control switches 24, 25, 44 and 45 are controlled by a control circuit 54 through control lines 28, 29, 53 and 52 respectively.

Positive and negative differential input ends 80 and 81 of an offset detection circuit 46 are connected to the lines 17 and 18 respectively, while an output end 82 thereof is grounded through a capacitor 47. The offset detection circuit 46 comprises a variable current source 56, which is controlled by the control circuit 54 through a control line 51.

The output end 82 of the offset detection circuit 46 is connected to a negative differential input end 71 of an offset adjusting circuit 55, while a power source 48 is connected to a positive differential input end 70 thereof. Further, a positive-phase differential output end 73 of the offset adjusting circuit 55 is connected to an end of the resistor 7 through a line 49, while a reverse-phase output end 72 thereof is connected to an end of the resistor 8 through a line 50 respectively.

The control circuit 54 is provided with a read/write switching terminal 31 for receiving a read/write switching signal R/W, a head selection terminal 32 for receiving a head selection signal HS, and a chip disable control terminal 33 for receiving a chip disable signal CD.

Figure 5:
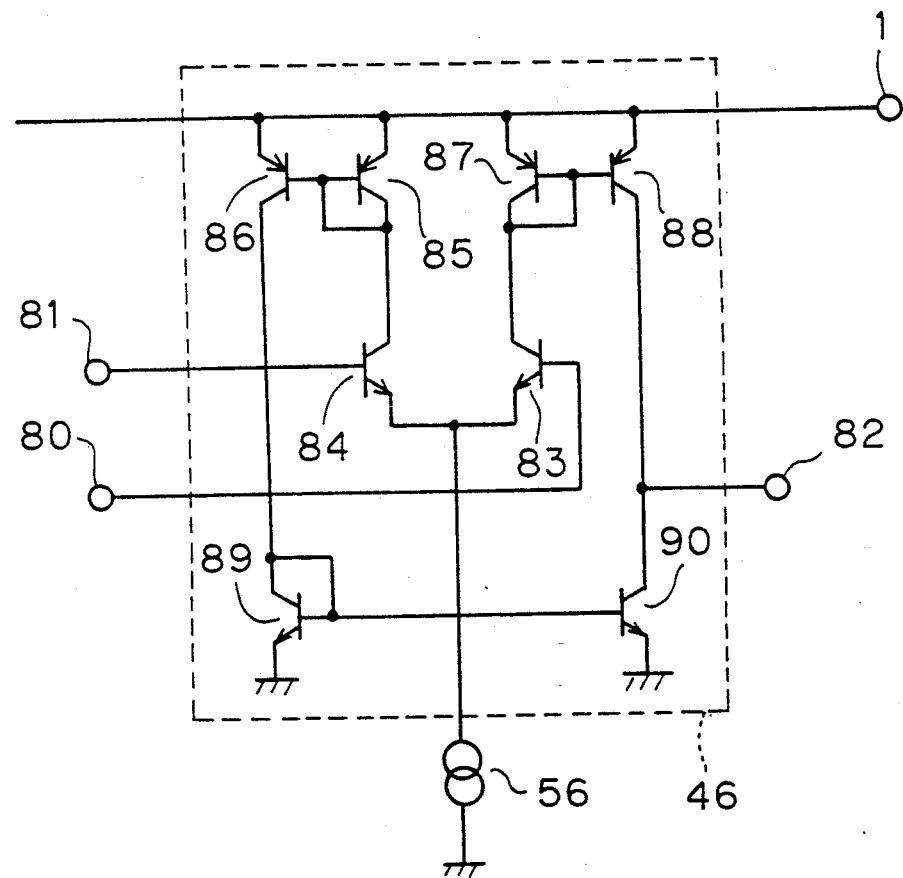
FIG. 5 is a circuit diagram showing the internal structure of an offset detection circuit 46.

FIG. 5 shows an exemplary internal structure of the offset detection circuit 46. The positive and negative input ends 80 and 81 of the offset detection circuit 46 are connected to bases of NPN transistors 83 and 84 respectively. Emitters of the transistors 83 and 84 are connected in common and grounded through a current source 56. The collector of the transistor 84 is connected to that of a PNP transistor 85, which has an emitter connected to the power source and a base connected to its own collector and the base of another PNP transistor 86 respectively. The transistor 86 has an emitter and a collector which are connected to the power source 1 and the collector of an NPN transistor 89 respectively. The collector of the transistor 83 is connected to that of a PNP transistor 87, which has an emitter connected to the power source 1 and a base connected to its own collector and the base of a PNP transistor 88 respectively. The emitter of the transistor 88 is connected to the power source 1, while its collector is connected to that of an NPN transistor 90 as well as to the output end 82. The base of a transistor 89 is connected to its own collector and the base of the transistor 90, and the emitters of the transistors 89 and 90 are grounded.

An output current from the offset detection circuit 46 is taken out in proportion to the value of the current source 56.

Figure 6:
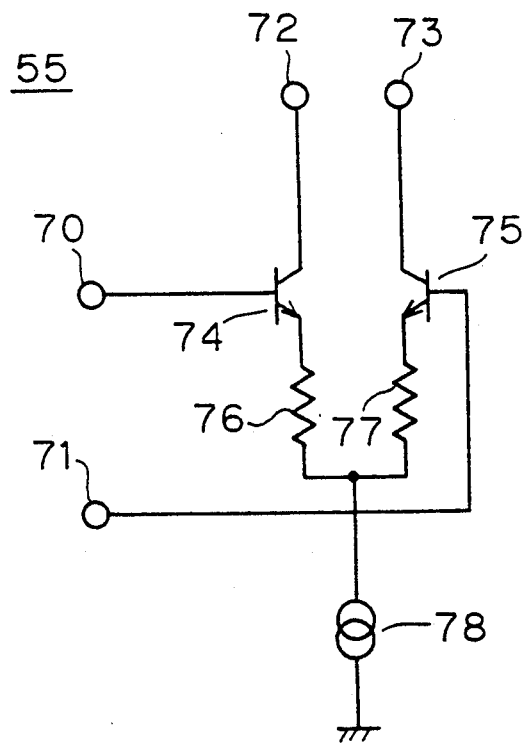
FIG. 6 is a circuit diagram showing the internal structure of an offset adjusting circuit 55.
Figure 7:
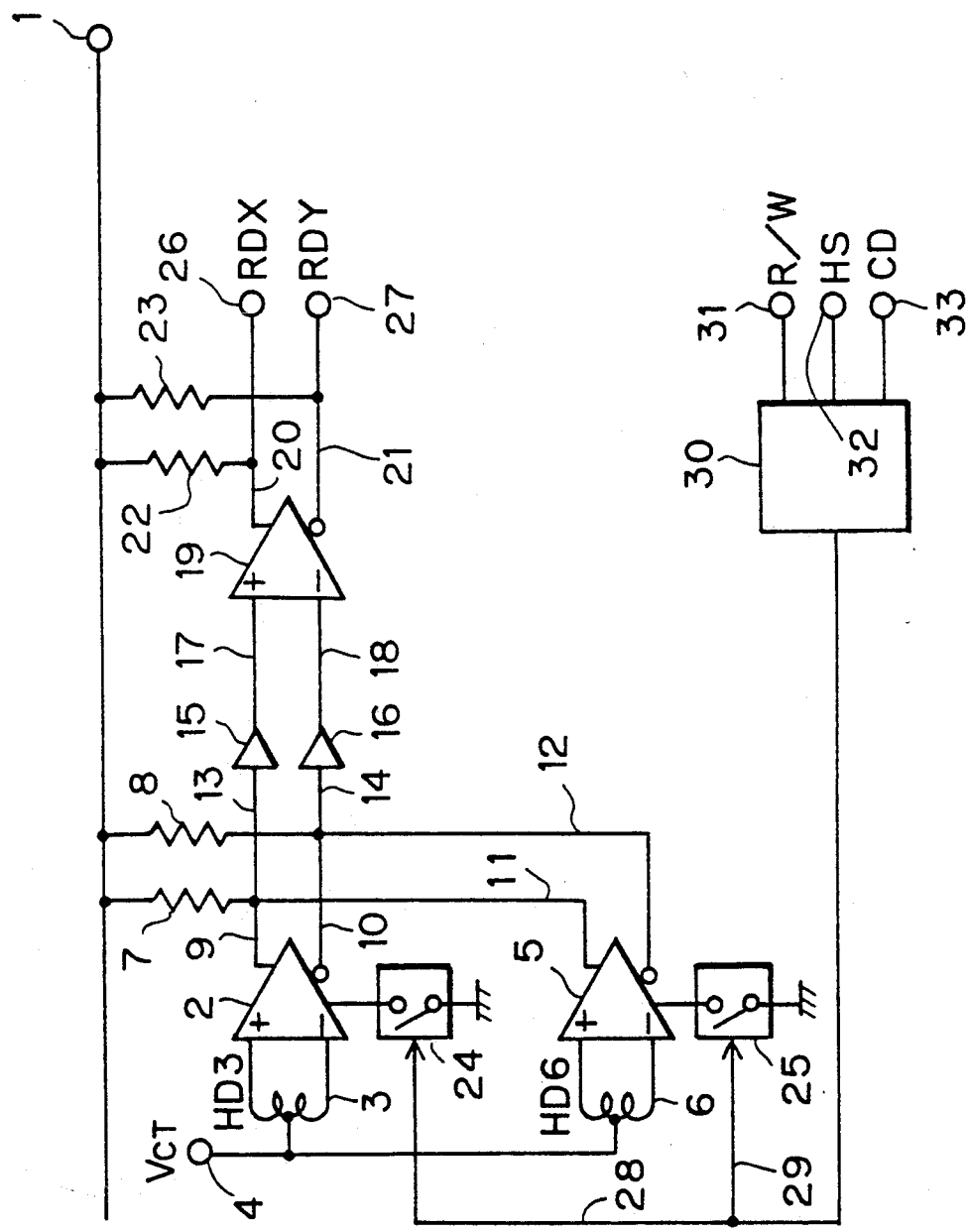
FIG. 7 is a circuit diagram of a conventional magnetic read/write circuit, showing a part which is related to a reproducing operation.

FIG. 6 shows an exemplary internal structure of the offset adjusting circuit 55. The positive and negative differential input ends 70 and 71 are connected to the bases of NPN transistors 74 and 75 respectively, while the collectors of the transistors 74 and 75 are connected to the reverse-phase and positive-phase output ends 72 and 73 respectively. The emitters of the transistors 74 and 75 are connected in common through resistors 76 and 77 respectively, and the junction therebetween is grounded through a current source 78. The resistors 76 and 77 are adapted to set the gain of differential outputs, and may be set at zero. When the current fed from the current source 78 is zeroized, the offset adjusting circuit 55 enters an OFF state. FIG. 6 shows an open-collector type structure, and the amplifiers 2, 5, 19 and 40 have similar structures.

The operation of the reproducing circuit shown in FIG. 1 is now described in relation to mode switching.

Figure 2:
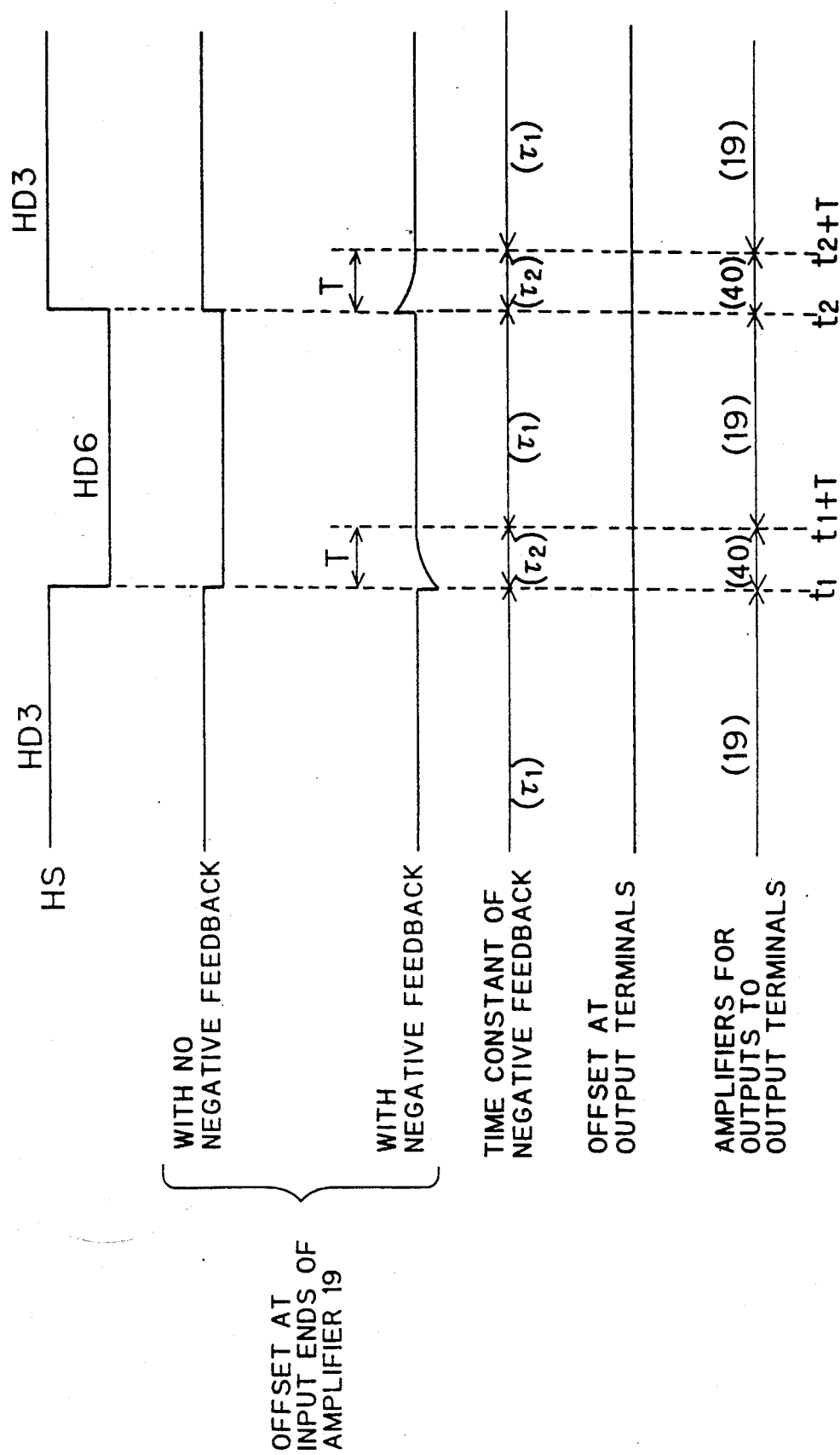
FIG. 2 is a timing chart showing the operation of the embodiment of the present invention.

A. In Head Switching (refer to FIG. 2)

(1) Consider that the head 3 (HD3) is first selected in reproduction ($t<t_1$). The amplifiers 2 and 5 have been brought into ON and OFF states by the control switches 24 and 25 respectively. If a time T described below has already been passed upon selection of the head 3, the amplifiers 19 and 40 have been brought into ON and OFF states by the control switches 44 and 45 respectively, and the output of the amplifier 19 has been transmitted to the output terminals 26 and 27. Further, since the offset at the input ends of the amplifier 19 is suppressed small due to negative feedback by a long time constant $\tau_1$ as hereinafter described, an offset appearing at the output terminals 26 and 27 is suppressed small.

(2) Then, the head 6 (HD6) is selected by the signal HS received in the head selection terminal 32 ($t=t_1$). Namely, the control circuit 54 turns the control switches 24 and 25 off and on respectively through the control lines 28 and 29, whereby the amplifiers 2 and 5 enter OFF and ON states respectively.

At this time, the control circuit 54 turns the control switches 44 and 45 off and on respectively through the control lines 53 and 52, and supplies the differential output of the amplifier 40 to the output terminals 26 and 27.

The offset detection circuit 46 receives signals, which are transmitted to the lines 17 and 18, in the differential input ends 80 and 81, to amplify the offset appearing at the input ends of the amplifier 19 and output the same to the output end 82, and transmits this to the negative input end 71 of the offset adjusting circuit 55.

The offset adjusting circuit 55 provides negative feedback through the lines 49 and 50 for reducing fluctuation of the offset at the input ends of the amplifier 19 detected by the offset detection circuit 46. While the offset at the input ends of the amplifier 19 is temporarily extremely fluctuated at the time $t_1$, the same is finally suppressed small by this negative feedback. In order to quickly suppress this offset, a time constant $\tau_2$ of the negative feedback is reduced.

This is implemented by the control circuit 54, which increases the current of the current source 56 through the control line 51 at the time $t_1$. Due to such increase of the current at the current source 56, the output current value of the offset detection circuit 46 is so increased that the time constant $\tau_2$ of the negative feedback, which is set by this current value and the capacitor 47, is reduced as compared with the time constant $\tau_1$ described in the item (1).

While the fluctuation of the offset at the input ends of the amplifier 19 is quickly suppressed, the fluctuation of the offset caused immediately upon head switching inevitably appears at the output terminals if the same is directly transmitted to the output terminals. Therefore, the control circuit 54 supplies the differential outputs of the amplifier 40 to the output terminals 26 and 27 during a constant period T from the time $t_1$ until the offset at the input ends of the amplifier 19 is sufficiently suppressed, as described above. Namely, the offset of the amplifier 40 appears at the output terminals 26 and 27 between the times $t_1$ and $t_1+T$.

While fluctuation from the offset of the amplifier 19 to that of the amplifier 40 is caused at this time, such fluctuation can be suppressed small since the same is merely related to the single-stage amplifier 19 or 40. The differential input ends of the amplifier 40 are provided with the same potential by the power source 43 and the offset appearing at the output terminals 26 and 27 is that of the single-stage amplifier. Thus, it is possible to avoid extreme offset fluctuation in relation to two-stage amplifiers 2 and 19 or 5 and 19, dissimilarly to the conventional case.

After the time $t_1+T$, the output of the amplifier 19 including the signal from the head 6 is transmitted to the output terminals 26 and 27 since fluctuation of the offset at the input ends of the amplifier 19 has already been suppressed small by the negative feedback. Namely, the control circuit 54 turns the control switches 44 and 45 on and off respectively through the control lines 53 and 52 at the time $t_1+T$, thereby turning the amplifiers 19 and 40 on and off respectively. Also after the time $t_1+T$, the negative feedback is regularly provided by the offset detection circuit 46 and the offset adjusting circuit 55. However, the time constant $\tau_1$ thereof must be longer than the time constant $\tau_2$ of the negative feedback provided immediately after head switching. Otherwise not only the offset received in the input ends of the amplifier 19 but also a signal component including information other than the offset are inevitably subjected to the negative feedback, to result in damage of the information read in the head 6. In order to increase the time constant $\tau_1$, the control circuit 54 reduces the value of the current fed by the current source 56 through the control line 51 at the time $t_1+T$. Thus, the value of the current flowing in the output end of the offset detection circuit 46 is reduced, so that the time constant $\tau_1$ of the negative feedback, which is set by this current value and the capacitor 47, is longer than the time constant $\tau_2$.

(3) Then, the head 3 (HD3) is again selected ($t=t_2>t_1+T$). Namely, the control circuit 54 turns the control switches 24 and 25 on and off respectively through the control lines 28 and 29, thereby turning the amplifiers 2 and 5 on and off respectively.

Similarly to the case where the head 6 is selected from the head 3, the control circuit 54 increases the current of the current source 56 through the control line 51 at a time $t_2$ and turns the control switches 44 and 45 off and on respectively through the control lines 53 and 52, to supply the differential outputs of the amplifier 40 to the output terminals 26 and 27. Thus, it is possible to output the small offset of the amplifier 40 at the output terminals 26 and 27 while quickly suppressing the offset appearing at the input ends of the amplifier 19 with the time constant $\tau_2$. After a lapse of the time T, the outputs of the amplifier 19 are transmitted to the output terminals 26 and 27 at a time $t_2+T$ when the offset at the input ends of the amplifier 19 is sufficiently reduced, to increase the time constant of the negative feedback.

Namely, a constant period is ensured after head switching to suppress fluctuation of the signal offset by providing the negative feedback while a substitution signal of a small offset is outputted, whereby it is possible to reduce fluctuation of the offset appearing at the output terminals 26 and 27.

B. In Read/Write Switching (refer to FIG. 3)

(1) Consider that a reproducing operation (shown by "R" in the figure) is first performed ($t<t_1$) when a certain head such as the head 3 (HD3), for example, is selected. The amplifiers 2 and 5 have been brought into ON and OFF states respectively by the control switches 24 and 25. If the time T has already been passed upon starting of the read operation, the amplifiers 19 and 40 have been brought into ON and OFF states respectively by the control switches 44 and 45. Namely, the outputs of the amplifier 19 have been transmitted to the output terminals 26 and 27. In this state, the offset at the input ends of the amplifier 19 is suppressed small by negative feedback by the long time constant $\tau_1$, and that appearing at the output terminals 26 and 27 is also suppressed small, similarly to the above case described with reference to "A. In Head Switching" of this embodiment.

(2) When a recording operation (shown by "W" in the figure) is performed ($t_1<t<t_2$), it is not necessary to transmit a reproduction signal, which has been transmitted to the amplifier 19, to the output terminals 26 and 27, but the outputs of the amplifier 40 are transmitted to the output terminals 26 and 27. Namely, the control circuit 54 receives the read/write switching signal R/W (value "W") at the time $t=t_1$ to turn the control switches 44 and 45 off and on respectively through the control lines 53 and 52, whereby the amplifiers 19 and 40 enter OFF and ON states respectively. Since the offset of the amplifier 40 is also suppressed small as already described, it is possible to suppress fluctuation of the offset at the output terminals 26 and 27 small in switching from the reproducing operation to a recording operation.

Since no read signal is needed to read out in the write operation, the amplifier 2 is also turned off by the control switch 24 similarly to the amplifier 5. Since no signal components including information are carried on the lines 17 and 18 at this time, the time constant of the negative feedback may be either long ($\tau_1$) or short ($\tau_2$). Namely, the value of the current fed by the current source 56 may be either large or small.

(3) When the write operation is switched to the read operation ($t=t_2$), a constant time T is ensured and negative feedback is provided to suppress the signal offset, while substitution signals of a small offset are outputted at the output terminals 26 and 27, similarly to the case of head switching.

In more concrete terms, the control circuit 54 receives the read/write switching signal R/W (value "R") at the time $t=t_2$, to perform the following control: (a) increase the current to be fed to the current source 56 through the control line 51, to reduce the negative feedback time constant ($\tau_2$). (b) turn the amplifier 2 on through the control line 28, to transmit the read signal of the head 3 (HD3) to the lines 13 and 14. (c) Since the amplifiers 19 and 40 have already been turned off and on respectively at $t_1<t<t_2$, these amplifiers are not switched at $t=t_2$.

Figure 3:
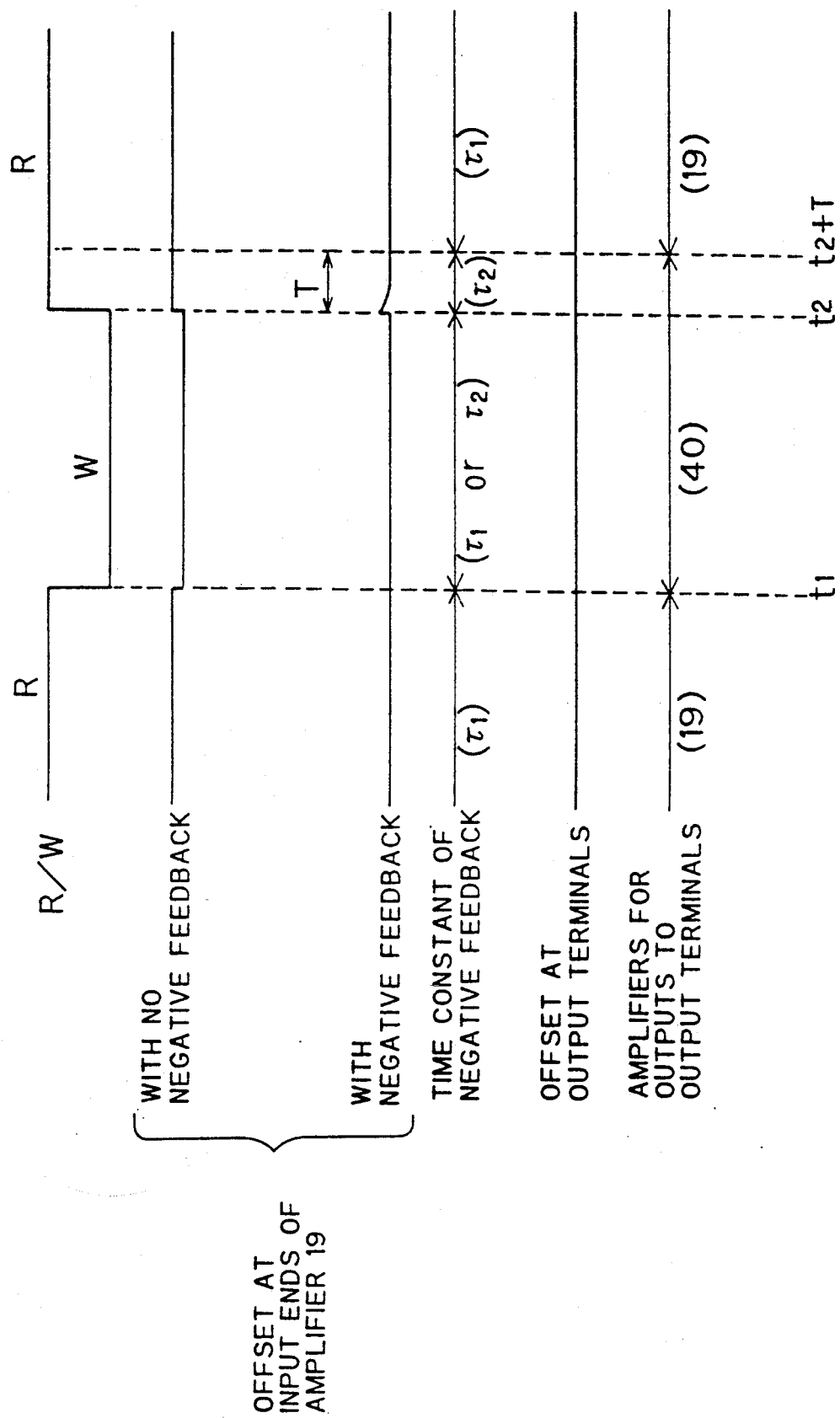
FIG. 3 is a timing chart showing the operation of the embodiment of the present invention.

The offset detection circuit 46 and the offset adjusting circuit 55 provide the negative feedback by the time constant $\tau_2$, so that the offset at the input ends of the amplifier 19 is quickly suppressed small. FIG. 3 also shows an offset appearing at the amplifier 19 when no negative feedback is provided, for the purpose of comparison. At the time $t_2+T$ after a lapse of the constant time T from the time $t_2$, the outputs of the amplifier 19 are transmitted to the output terminals 26 and 27 since the offset at the input ends of the amplifier 19 has already been suppressed small by the negative feedback. Namely, the control circuit 54 turns the control switches 44 and 45 on and off respectively through the control lines 53 and 52, and turns the amplifiers 19 and 40 on and off respectively. At the output terminals 26 and 27, offset fluctuation is caused at the time $t_2+T$ since the offset of the amplifier 40 appears before the time $t_2+T$ while the already reduced offset of the amplifier 19 appears after the time $t_2+T$. Dissimilarly to the conventional case, however, it is possible to avoid offset fluctuation for two-stage amplifiers, similarly to the case of head switching.

After the time $t_2+T$, the negative feedback time constant is selected long ($\tau_1$) so that no information of a signal component including information other than the offset is damaged. In more concrete terms, the control circuit 54 reduces the value of the current fed by the current source 56 through the control line 51 at the time $t_2+T$.

Figure 4:
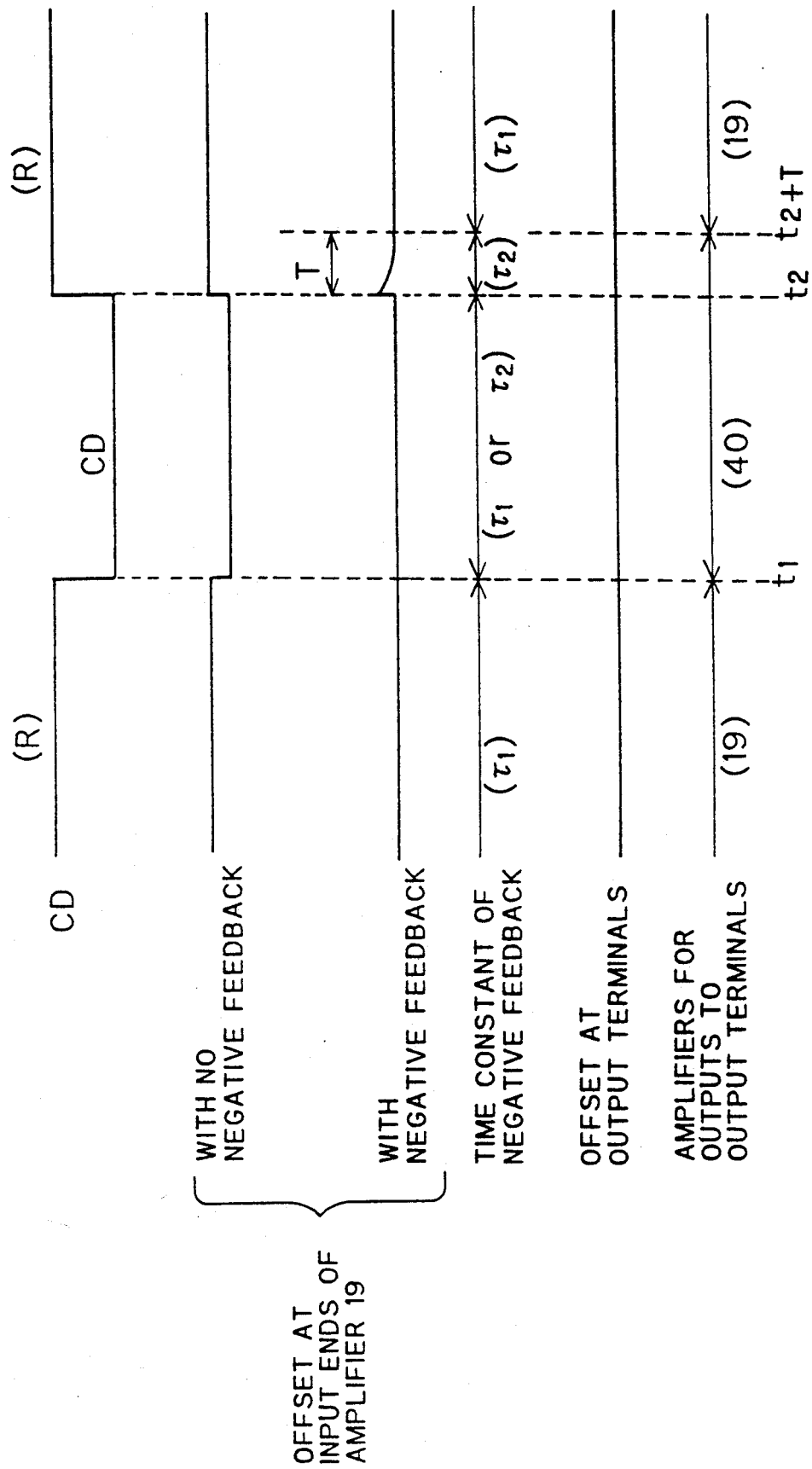
FIG. 4 is a timing chart showing the operation of the embodiment of the present invention.

C. In Chip Disable Switching (refer to FIG. 4)

An operation similar to that in read/write switching is performed also in chip disable switching.

(1) When a certain head, such as the head 3 (HD3), for example, is selected, the amplifiers 2, 5, 19 and 40 are in ON, OFF, ON and OFF states in read mode respectively. The input terminals of the amplifier 19 are subjected to negative feedback with the long time constant $\tau_1$, and the offset appearing at the output terminals 26 and 27 is suppressed small.

(2) When the chip disable signal CD is received in the control circuit 54 at the time $t_1$, the amplifier 2 is turned off similarly to the amplifier 5. Therefore, no read signal is needed to read out, the control circuit 54 turns the control switches 44 and 45 off and on respectively through the control lines 53 and 52 for the amplifiers 19 and 40 to be also turned off and on respectively. Since the offset of the amplifier 40 is small, no large offset difference is caused whether the outputs of the amplifier 19 or those of the amplifier 40 are transmitted to the output terminals 26 and 27, similarly to the case described with reference to "B. In Read/Write Switching" of this embodiment. Therefore, it is possible to suppress offset fluctuation at the output terminals 26 and 27 in chip disable switching. Since no signal components including information are carried on the lines 17 and 18 in a chip disable state, the negative time constant may be either long ($\tau_1$) or small ($\tau_2$). Namely, the current fed by the current source 56 may be either large or small.

(3) When the chip disable state is switched to a read operation at the time $t=t_2$, the control circuit 54 performs the same control as that in the case of switching from the write operation to the read operation. Thus, although offset fluctuation is caused at the time $t_2+T$, it is possible to avoid large offset fluctuation, dissimilarly to the conventional case.

Thus, the offset at the output terminals 26 and 27 in mode switching is reduced. The time T is preferably about 1 to 2 μs, since it is difficult to read out the read signal if this time is too long.

While the invention has been shown and described in detail, the foregoing description is in all aspects illustrative and not restrictive. It is therefore understood that numerous modifications and variations can be devised without departing from the scope of the invention.

What is claimed is:

1. A magnetic read/write circuit comprising:
   (a) differential output terminals;
   (b) at least one first differential amplifier having output ends for outputting first differential signals;
   (c) a second differential amplifier having input ends for receiving said first differential signals and output ends being connected with said differential output terminals and outputting second differential signals;
   (d) a reference signal generating part having output ends being connected to said differential output terminals, and outputting reference differential signals;
   (e) a negative feedback circuit for providing negative feedback to said first differential signals with a variable time constant; and
   (f) a control circuit for controlling operations of said first differential amplifier, said second differential amplifier, said reference signal generating part and said negative feedback circuit,
   said control circuit selectively supplying said second differential signals and said reference differential signals to said differential output terminals in synchronization with the operation of said first differential amplifier,
   said control circuit further controlling said negative feedback circuit by employing a relatively short said time constant in a constant period after starting of said operation of said first differential amplifier while employing a relatively long said time constant in operation of said first differential amplifier at a time other than said constant period.

2. A magnetic read/write circuit in accordance with claim 1, further comprising a buffer amplifier provided between said first differential amplifier and said second differential amplifier for transmitting said first differential signals.

3. A magnetic read/write circuit in accordance with claim 2, wherein said negative feedback circuit comprises an offset detection circuit for receiving said first differential signals from said input ends of said second differential amplifier and outputting the offset of said first differential signals with a variable time constant, a reference voltage source, and an offset adjusting circuit for receiving the voltage of said reference voltage source and said offset of said first differential signals and supplying feedback signals to said output ends of said first differential amplifier.

4. A magnetic read/write circuit in accordance with claim 1, wherein said first differential amplifier is of an open collector type.

5. A magnetic read/write circuit in accordance with claim 4, wherein said negative feedback circuit is of an open collector type.

6. A magnetic read/write circuit in accordance with claim 5, wherein said second differential amplifier is of an open collector type.

7. A magnetic read/write circuit in accordance with claim 6, wherein said reference signal generating part is of an open collector type.

8. A magnetic read/write circuit in accordance with claim 3, wherein said offset detection circuit comprises a capacitor at its output end, as well as a current source supplying a current value controlled by said control circuit for determining said time constant, and a third differential amplifier.

9. A magnetic read/write circuit in accordance with claim 8, wherein said reference signal generating part is a fourth differential amplifier comprising differential input ends to which equivalent reference voltages are applied.

10. A magnetic read/write circuit in accordance with claim 1, wherein said control circuit supplies said reference differential signals to said differential output terminals simultaneously with stoppage of operation of said first differential amplifier while supplying said second differential signals after said constant period to said differential output terminals respectively.

11. A magnetic read/write circuit in accordance with claim 10, wherein said at least one first differential amplifier is provided in plural, to be exclusively selected to operate.

12. A magnetic read/write circuit in accordance with claim 10, wherein said control circuit drives said first differential amplifier in magnetic read mode.

13. A magnetic read/write circuit in accordance with claim 12, wherein said control circuit stops said first differential amplifier in magnetic write mode.

14. A magnetic read/write circuit in accordance with claim 12, wherein said control circuit stops said first differential amplifier in chip disabling.

* * * * *